United States Patent
Kim et al.

(10) Patent No.: US 8,202,762 B2
(45) Date of Patent: Jun. 19, 2012

(54) STACK PACKAGE HAVING REDUCED ELECTRICAL CONNECTION LENGTH SUITABLE FOR HIGH SPEED OPERATIONS AND METHOD OF MANUFACTURING THE SAME

(75) Inventors: Sung Min Kim, Seoul (KR); Min Suk Suh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/218,916

(22) Filed: Aug. 26, 2011

(65) Prior Publication Data
US 2011/0312128 A1    Dec. 22, 2011

Related U.S. Application Data

(62) Division of application No. 11/754,555, filed on May 29, 2007, now abandoned.

(30) Foreign Application Priority Data

Dec. 29, 2006 (KR) .................. 10-2006-0138530

(51) Int. Cl.
*H01L 21/60* (2006.01)

(52) U.S. Cl. ........ 438/107; 438/613; 438/618; 438/106; 438/455; 438/612; 438/615; 438/652; 257/737; 257/E23.01; 257/776; 257/E21.476

(58) Field of Classification Search .................. 438/107, 438/613, 618, 109, 455, 612, 652; 257/E23.01, 257/737, E21.476
See application file for complete search history.

(56) References Cited

U.S. PATENT DOCUMENTS

| 5,229,647 | A | 7/1993 | Gnadinger |
| 7,112,520 | B2 | 9/2006 | Lee et al. |
| 7,282,444 | B2 | 10/2007 | Tanida et al. |
| 2006/0211167 | A1 | 9/2006 | Knickerbocker et al. |

FOREIGN PATENT DOCUMENTS

| CN | 1591839 A | 3/2005 |
| CN | 1655333 A | 8/2005 |
| KR | 1020040100770 A | 12/2004 |

OTHER PUBLICATIONS

USPTO OA mailed Apr. 28, 2009 in connection with U.S. Appl. No. 11/754,555.
USPTO OA mailed Aug. 18, 2009 in connection with U.S. Appl. No. 11/754,555.
USPTO OA mailed Feb. 18, 2010 in connection with U.S. Appl. No. 11/754,555.
USPTO OA mailed Jun. 1, 2001 in connection with U.S. Appl. No. 11/754,555.

*Primary Examiner* — Junghwa M Im
(74) *Attorney, Agent, or Firm* — Ladas & Parry LLP

(57) ABSTRACT

A stack package includes an upper semiconductor chip having a plurality of first bonding pads which are formed on an upper surface of the upper semiconductor chip and via-holes which are defined in the upper semiconductor chip under the respective first bonding pads; and a lower semiconductor chip attached to a lower surface of the upper semiconductor chip and having a plurality of second bonding pads which are formed on an upper surface of the lower semiconductor chip and bumps which are formed on the respective second bonding pads and are inserted into the respective via-holes to be come into the respective first bonding pads.

10 Claims, 6 Drawing Sheets

STACK PACKAGE HAVING REDUCED ELECTRICAL CONNECTION LENGTH SUITABLE FOR HIGH SPEED OPERATIONS AND METHOD OF MANUFACTURING THE SAME

CROSS-REFERENCE TO RELATED APPLICATION

The present application claims priority to Korean patent application number 10-2006-0138530 filed on Dec. 29, 2006, which is incorporated herein by reference in its entirety.

BACKGROUND OF THE INVENTION

The present invention relates to a stack package, and more particularly to a stack package which reduces delay in transmission of an electrical signal and a method of manufacturing the same.

Semiconductor devices in most electronic products are found in a form of packages. Various shapes and sizes of semiconductor packages are required to cater to different characteristics of various electronic products.

The trend in the electronic industry requires that the semiconductor devices be capable of high capacity, high integration, and high speed operation. Any semiconductor package manufactured using a single semiconductor chip has limitations in accomplishing high integration and high capacity. For this reason, stack packages are drawing attention as they are capable of achieving higher memory density through stacking of multiple semiconductor chips.

In general, a stack package can be produced by either stacking several semiconductor chips in a unit package or stacking several unit packages each having a semiconductor chip. The stack package is designed such that each semiconductor chip in a unit package or each of the stacked unit packages receives the same external electrical signals.

The stack package can be formed at a chip-level or at a wafer-level.

A chip-level stack package is manufactured by stacking and molding the individual semiconductor chips that were separated into individual chips through sawing a wafer having undergone the semiconductor manufacturing processes. A wafer-level stack package is manufactured by stacking wafers having undergone the semiconductor manufacturing processes and packaging the stacked wafers together, and thereafter cutting the stacked wafers along the scribe lines to separate into chip-level pieces for manufacturing the packages in a final process step.

The wafer-level stack package is referred to as a chip-scale package, because the size of a package is about the same size as the semiconductor chip packaged therein. This reduces the package's footprint required for electrical connection and thereby increases the efficiency of the substrate hosting the package.

Also, the wafer-level stack packages require smaller mounting area and shorter wiring length than the conventional lead-type packages, and thus it is considered advantageous to apply the wafer-level stack packages in the high frequency devices.

However, the conventional stack packages require the wire rerouting processes or the wire bonding processes to electrically connect the upper and lower semiconductor chips or the stacked unit packages.

This leads to increased electrical connection lengths between the semiconductor chips or between the unit packages and prevents the stack packages from being easily applied to high-speed operation products.

Further, the increased length of the electrical connection in the conventional stack packages causes the sizes of the stack packages to also increase.

SUMMARY OF THE INVENTION

An embodiment of the present invention is directed to a stack package, which reduces delay in transmission of an electrical signal, and a method of manufacturing the same.

Another embodiment of the present invention is directed to a light, slim, and compact stack package, which can be adapted to for high-speed operations, and a method of manufacturing the same.

In one embodiment, a stack package comprises an upper semiconductor chip having a plurality of first bonding pads which are formed on an upper surface of the upper semiconductor chip and via-holes which are defined in the upper semiconductor chip under the respective first bonding pads; and a lower semiconductor chip attached to a lower surface of the upper semiconductor chip and having a plurality of second bonding pads which are formed on an upper surface of the lower semiconductor chip and bumps which are formed on the respective second bonding pads and are inserted into the respective via-holes to be come into the respective first bonding pads.

The via-hole and the bump have the same sectional shape.

The via-hole and the bump have the sectional shape of a trapezoid.

The lower semiconductor chip includes an insulation layer which is formed on the upper surface of the lower semiconductor chip in such a way as to expose the second bonding pads.

The stack package further comprises a bonding material interposed between the upper and lower semiconductor chips.

The bumps are made of metal.

The bumps are formed of aluminum or copper.

The bumps include a metal seed layer formed at the interface with the second bonding pads.

The metal seed layer is formed of aluminum or copper.

In another embodiment, a method of manufacturing a stack package comprises the steps of forming a first mask pattern on a lower surface of a first semiconductor chip which has a plurality of first bonding pads formed on an upper surface thereof, to expose portions of the lower surface of the first semiconductor chip which correspond to the respective first bonding pads; defining via-holes by etching the exposed portions of the lower surface of the first semiconductor chip, to expose the first bonding pads; constituting an upper semiconductor chip by removing the first mask pattern; forming an insulation layer on a second semiconductor chip which has a plurality of second bonding pads formed on an upper surface thereof in the same manner as the first semiconductor chip, to expose the second bonding pads; forming a metal seed layer on the exposed second bonding pads and the insulation layer; forming on the metal seed layer a second mask pattern having openings which expose upper regions of the second bonding pads; forming bumps by plating a metal layer on portions of the metal seed layer which are exposed through the openings of the second mask pattern, to fill the openings; constituting a lower semiconductor chip by removing the second mask pattern and the other portions of the metal seed layer which exist under the second mask pattern; and attaching the lower semiconductor chip to the lower surface of the upper semiconductor chip such that the bumps are inserted into the respective via-holes and are come into the respective first bonding pads.

The step of forming the first mask pattern through the step of attaching the lower semiconductor chip to the upper semiconductor chip are implemented at a wafer-level.

After the step of attaching the lower semiconductor chip to the upper semiconductor chip, the method further comprises the step of cutting the upper and lower semiconductor chips attached to each other at the wafer-level, into a chip-level.

The second mask pattern is formed to have the openings which possess the sectional shape of a trapezoid.

The via-holes and the bumps have the same sectional shape of a trapezoid.

The step of defining the via-holes is implemented using the first bonding pads as an etch stop layer.

The upper and lower semiconductor chips are attached to each other by the medium of a bonding material.

The bonding pads of the upper semiconductor chip and the metal bumps of the lower semiconductor chip are attached to each other through a heat-pressing process.

The bumps are formed of aluminum or copper.

The metal seed layer is formed of aluminum or copper.

DESCRIPTION OF SPECIFIC EMBODIMENTS

In the present invention, an upper semiconductor chip has via holes with opening on the lower surface thereof such that the via-holes expose the bonding pads formed on the other (i.e., upper) side. A lower semiconductor chip has bonding pads formed on the upper surface thereof with metal bumps formed over the bonding pads to correspond to the via-holes of the upper semiconductor chip. For stacking, the bumps of the lower semiconductor chip are fitted into the via holes of the upper semiconductor chip at a wafer-level.

In detail, in a stack package according to the present invention, the metal bumps of the lower semiconductor chip are respectively inserted into the via-holes of the upper semiconductor chip such that the metal bumps of the lower semiconductor chip are come into the bonding pads of the upper semiconductor chip.

Accordingly, in the present invention, by shortening the electrical connection paths between the upper and lower semiconductor chips, it is possible to provide a stack package which can minimize delay in the transmission of an electrical signal.

Therefore, the stack package according to the present invention can be adapted to for high-speed operations and can be made to be of light, slim, and compact.

Hereafter, a stack package in accordance with an embodiment of the present invention will be described in detail.

Figure 1:
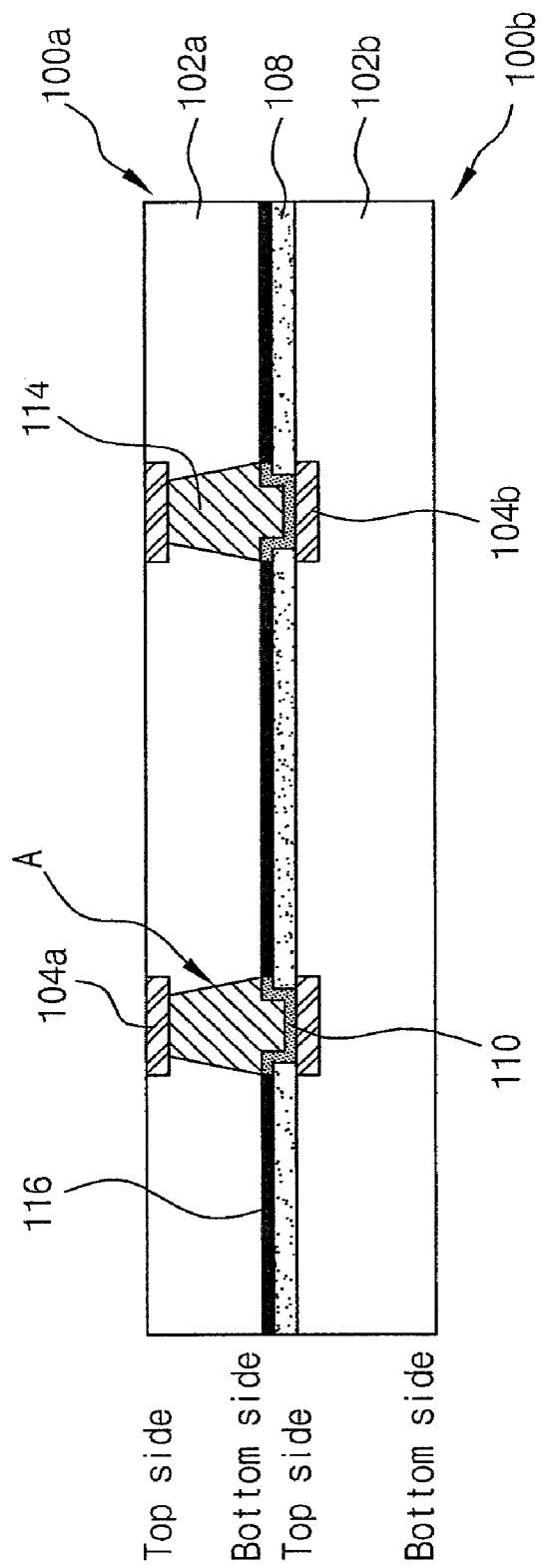
FIG. 1 is a cross-sectional view illustrating a stack package in accordance with an embodiment of the present invention.

FIG. 1 is a cross-sectional view illustrating a stack package in accordance with an embodiment of the present invention.

Referring to FIG. 1, a stack package in accordance with an embodiment of the present invention is formed by stacking an upper semiconductor chip 100a which is defined on the lower surface thereof with via-holes A for exposing first bonding pads 104a and a lower semiconductor chip 100b which is formed with metal bumps 114 for corresponding to the via-holes A.

The upper semiconductor chip 100a is formed using a first semiconductor chip 102a. The first semiconductor chip 102a has the plurality of first bonding pads 104a on the upper surface thereof and the via-holes A on the lower surface thereof, the via-holes A exposing the respective first bonding pads 104a.

The lower semiconductor chip 100b is formed using a second semiconductor chip 102b. The second semiconductor chip 102b has a plurality of second bonding pads 104b on the upper surface thereof. A metal seed layer 110 is formed on the second bonding pads 104b, and an insulation layer 108 is formed on the second semiconductor chip 102b excluding the metal seed layer 110. The bumps 114 having a sectional shape corresponding to that of the via-holes A of the first semiconductor chip 102a are formed on the metal seed layer 110. The bumps 114 are made of metal. The bumps 114 and the metal seed layer 110 are formed of aluminum or copper.

The bumps 114 of the lower semiconductor chip 100b are inserted into the respective via-holes A of the upper semiconductor chip 100a. According to this, the first bonding pads 104a of the upper semiconductor chip 100a and the bumps 114 of the lower semiconductor chip 100b are come into each other such that the upper and lower semiconductor chips 100a and 100b are electrically connected to each other.

The upper and lower semiconductor chips 100a and 100b are physically connected to each other by a bonding material 116 which is interposed between the first and second semiconductor chips 102a and 102b excluding the electrical connections.

The via-holes A and the bumps 114 resemble a trapezoidal cross-sectional shape when viewed with respect to the first and second semiconductor chips 102a and 102b.

As described above, in the stack package according to an embodiment of the present invention, the electrical connections between the stacked upper and lower semiconductor chips 100a and 100b are realized by establishing direct contacts between the first bonding pads 104a of the upper semiconductor chip 100a and the bumps 114 formed on the second bonding pads 104b of the lower semiconductor chip 100b.

Therefore, in the stack package according to the present invention, delay in the transmission of an electrical signal is minimized since the electrical connection paths between the upper and lower semiconductor chips 100a and 100b are shortened.

As a consequence, the stack package according to the present invention can be adapted for high-speed operations and can be made to be light, slim, and compact.

Hereafter, a method of manufacturing the stack package in accordance with an embodiment of the present invention will be described in detail. The manufacture of the stack package according to an embodiment of the present invention is implemented at a wafer-level.

FIGS. 2A through 2I are cross-sectional views explaining the process steps of a method of manufacturing the stack package in accordance with the embodiment of the present invention.

Figure 2A:
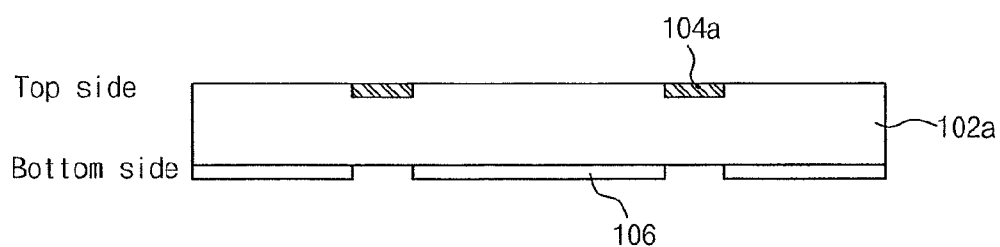
FIGS. 2A through 2I are cross-sectional views explaining the process steps of a method of manufacturing the stack package in accordance with an embodiment of the present invention.

Referring to FIG. 2A, a first mask pattern 106 is formed on the lower surface of the first semiconductor chip 102a which is formed, on the upper surface thereof, with the plurality of first bonding pads 104a for exchanging electrical signals with the outside. The first mask pattern 106 is made of a photoresist and is formed to expose portions of the lower surface of the first semiconductor chip 102a which correspond to the first bonding pads 104a.

Figure 2B:
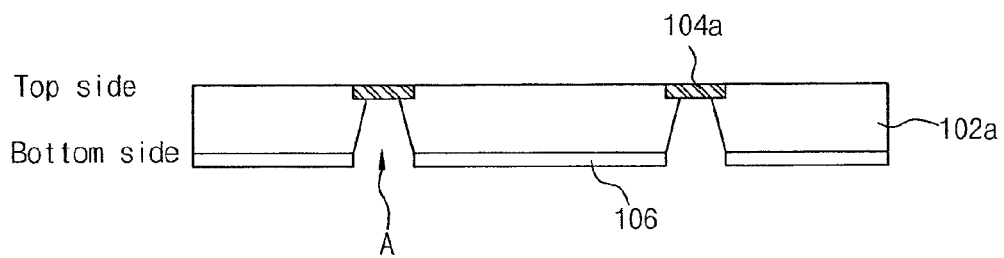

Referring to FIG. 2B, the via-holes A, which expose the lower surfaces of the first bonding pads 104a of the first semiconductor chip 102a, are defined on the lower surface of the first semiconductor chip 102a by conducting an etching process. At this time, the first mask pattern 106 is employed as an etch mask, and the first bonding pads 104a are employed as an etch stop layer.

The via-holes A which are defined on the lower surface of the first semiconductor chip 102a have the trapezoidal cross-sectional shape when viewed with respect to the upper surface of the first semiconductor chip 102a, that is, from the first bonding pads 104a. By changing the shape of the first mask pattern 106, the side slope of the via-holes A can be adjusted.

Figure 2C:
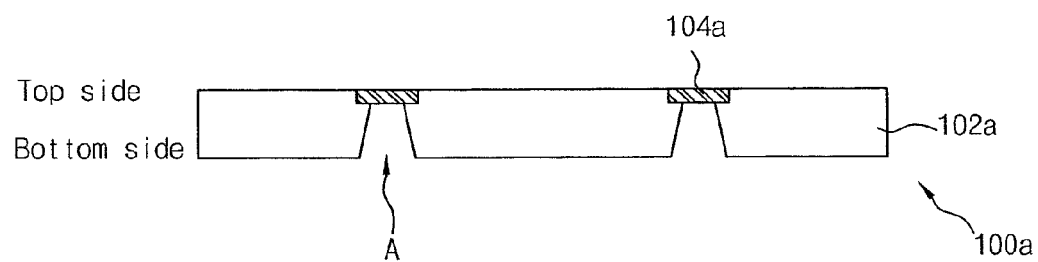

Referring to FIG. 2C, by removing the first mask pattern 106, which is formed on the lower surface of the first semiconductor chip 102a, the formation of the upper semiconductor chip 100a is completed.

Figure 2D:
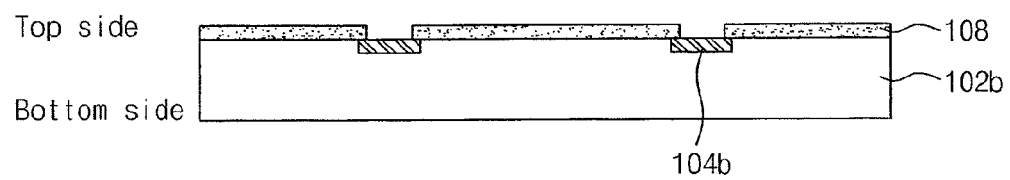

Referring to FIG. 2D, a mask pattern (not shown) for covering the second bonding pads 104b is formed on the upper surface of the second semiconductor chip 102b which has the same structure as the first semiconductor chip 102a before forming the first mask pattern 106 in FIG. 2A.

The insulation layer 108 is formed on the exposed portions of the second semiconductor chip 102b, and then, the mask pattern (not shown) is removed.

Figure 2E:
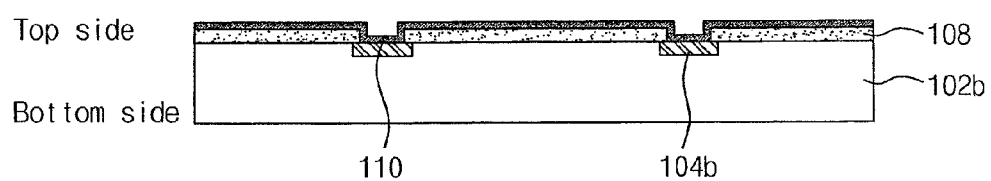

Referring to FIG. 2E, the metal seed layer 110 made of aluminum or copper is formed on the upper surface of the resultant second semiconductor chip 102b including the second bonding pads 104b, for a subsequent plating process. The metal seed layer 110 serves as under bump metallurgy for improving bonding force of electrical connection components to be formed over the second bonding pads 104b in the subsequent process.

Figure 2F:
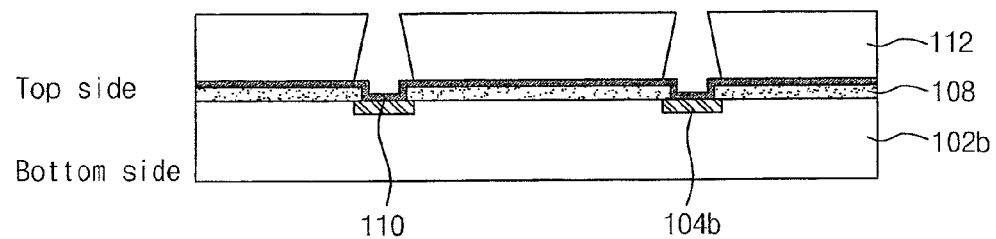

Referring to FIG. 2F, a second mask pattern 112 is formed on the metal seed layer 110 such that openings, which have the trapezoidal cross-sectional shape when viewed with respect to the upper surface of the second semiconductor chip 102b, expose portions of the metal seed layer 110 which are placed over the second bonding pads 104b. The second mask pattern 112 is made of a photoresist. The trapezoidal cross-sectional shape of the openings of the second mask pattern 112 corresponds to the trapezoidal cross-sectional shape of the via-holes A defined in the first semiconductor chip 102a as shown in FIG. 2C.

Figure 2G:
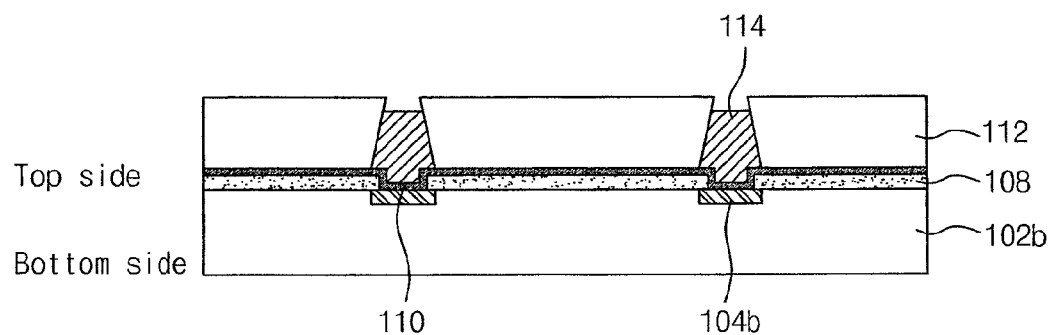

Referring to FIG. 2G, by conducting the plating process for the second semiconductor chip 102b which is formed with the second mask pattern 112, the bumps 114 are formed on the metal seed layer 110 which is electrically connected with the second bonding pads 104b. The bumps 114 are formed of aluminum or copper.

The bumps 114 are formed to have a trapezoidal cross-sectional shape corresponding to the trapezoidal cross-sectional shape of the via-holes A defined in the first semiconductor chip 102a as shown in FIG. 2C. The bumps 114 are formed to have a height which allows the upper ends of the bumps 114 to be come into the first bonding pads 104a of the first semiconductor chip 102a when the bumps 114 are inserted into the respective via-holes A.

Figure 2H:
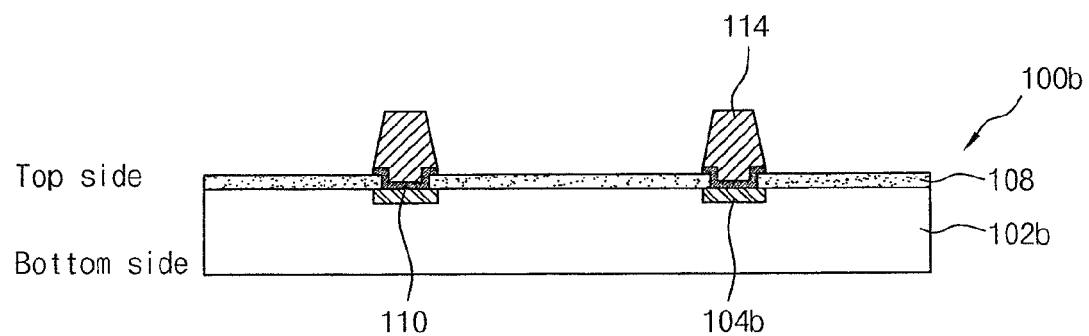

Referring to FIG. 2H, by removing the second mask pattern 112 and the other portions of the metal seed layer 110, which exist under the second mask pattern 112, the formation of the lower semiconductor chip 100b is completed.

The bonding material 116 is formed on the exposed portions of the insulation layer 108 of the lower semiconductor chip 100b.

Figure 2I:
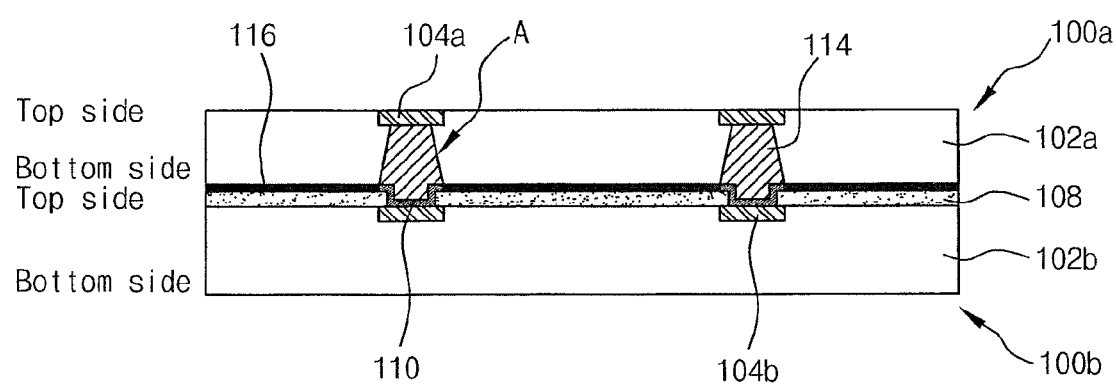

Referring to FIG. 2I, by inserting the bumps 114 formed on the lower semiconductor chip 100b into the respective via-holes A defined in the upper semiconductor chip 100a, the upper and lower semiconductor chips 100a and 100b are stacked one upon the other. The first semiconductor chip 102a and the second semiconductor chip 102b are physically attached to each other by the medium of the bonding material 116. The first bonding pads 104a of the first semiconductor chip 102a and the metal bumps 114 of the second semiconductor chip 102b are electrically connected by being attached to each other through a heat-pressing process.

Thereupon, while not shown in the drawings, the stack package formed at a wafer-level is cut out into individual semiconductor packages having the first and second semiconductor chips attached in the manner as described above.

Then, the individual stack package can be applied in an electronic product by wire bonding the bonding pads of the semiconductor package mounted thereon, or each individual stack package can be flip-chip bonded to the electronic product.

The stack package according to an embodiment of the present invention can also be manufactured in a manner such that the via-holes A are defined to have a size greater than that of the metal bumps 114 or the metal bumps 114 are formed to have a size less than that of the via-holes A, and an anisotropic conductive film (ACF) is interposed between the upper and lower semiconductor chips 100a and 100b.

In detail, by interposing the anisotropic conductive film between the upper and lower semiconductor chips and then conducting a pressing process, the upper and lower semiconductor chips 100a and 100b can be electrically and physically connected to each other so as to form the stack package.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method of manufacturing a stack package, comprising the steps of:

forming a first mask pattern on a lower surface of a first semiconductor chip having a plurality of first bonding pads formed on an upper surface thereof, wherein the first mask pattern exposes portions of the lower surface of the first semiconductor chip corresponding to the respective locations of the first bonding pads formed on the upper surface;

etching the exposed portions of the lower surface of the first semiconductor chip to expose the respective first bonding pads so as to define via holes;

constituting an upper semiconductor chip by removing the first mask pattern from the lower surface of the first semiconductor chip;

forming an insulation layer on an upper surface of a second semiconductor chip having a plurality of second bonding pads formed on the upper surface thereof in the same manner as the first semiconductor chip, wherein the insulation layer are formed to expose the second bonding pads;

forming a metal seed layer on the exposed second bonding pads and the insulation layer;

forming a second mask pattern on the metal seed layer wherein the second mask pattern has openings to expose the upper regions of the second bonding pads;

forming bumps by plating a metal layer to fill the openings of the second mask pattern such that the bumps are formed on the portions of the metal seed layer exposed through the openings of the second mask pattern;

constituting an lower semiconductor chip by removing the second mask pattern and any portions of the metal seed layer outside the openings of the second mask pattern of the second semiconductor chip; and attaching the lower semiconductor chip to the lower surface of the upper semiconductor chip such that the bumps of the lower semiconductor chip are inserted into the respective via-holes and are come into the respective first bonding pads.

2. The method according to claim 1, wherein all of the steps recited in claim 1 including the step of forming the first mask pattern to the step of attaching the lower and upper semiconductor chips are implemented at a wafer-level.

3. The method according to claim 2 further comprises the step of:

cutting the upper and lower semiconductor chips attached to each other at the wafer-level into a chip-level after performing the step of attaching the lower semiconductor chip to the upper semiconductor chip.

4. The method according to claim 1, wherein the second mask pattern is formed to have the openings having a trapezoidal cross-sectional shape.

5. The method according to claim 1, wherein the via-holes and the bumps have a same trapezoidal cross-sectional shape.

6. The method according to claim 1, wherein the step of defining the via-holes is implemented using the first bonding pads as an etch stop layer.

7. The method according to claim 1, wherein the upper and lower semiconductor chips are attached to each other by utilizing a medium of bonding material.

8. The method according to claim 1, wherein the bonding pads of the upper semiconductor chip and the metal bumps of the lower semiconductor chip are attached to each other through a heat-pressing process.

9. The method according to claim 1, wherein the bumps are formed of aluminum or copper.

10. The method according to claim 1, wherein the metal seed layer is formed of aluminum or copper.

* * * * *